(12) United States Patent
Nozawa et al.

(10) Patent No.: US 10,957,531 B2
(45) Date of Patent: Mar. 23, 2021

(54) METHOD OF MANUFACTURING SEMICONDUCTOR DEVICE

(71) Applicant: TOKYO ELECTRON LIMITED, Tokyo (JP)

(72) Inventors: Syuji Nozawa, Nirasaki (JP); Tatsuya Yamaguchi, Nirasaki (JP); Nagisa Sato, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 10 days.

(21) Appl. No.: 16/577,658

(22) Filed: Sep. 20, 2019

(65) Prior Publication Data
US 2020/0098561 A1 Mar. 26, 2020

(30) Foreign Application Priority Data
Sep. 25, 2018 (JP) .............................. JP2018-178254

(51) Int. Cl.
| | |
|---|---|
| *H01L 21/02* | (2006.01) |
| *H01L 21/311* | (2006.01) |
| *H01L 21/768* | (2006.01) |
| *B05D 1/00* | (2006.01) |
| *H01L 21/321* | (2006.01) |

(52) U.S. Cl.
CPC .......... *H01L 21/02118* (2013.01); *B05D 1/60* (2013.01); *H01L 21/022* (2013.01); *H01L 21/0217* (2013.01); *H01L 21/0228* (2013.01); *H01L 21/02164* (2013.01); *H01L 21/02271* (2013.01); *H01L 21/31116* (2013.01); *H01L 21/31133* (2013.01); *H01L 21/31144* (2013.01); *H01L 21/7682* (2013.01); *H01L 21/76802* (2013.01); *H01L 21/76843* (2013.01); *H01L 21/76877* (2013.01); *H01L 21/3212* (2013.01); *H01L 21/7684* (2013.01)

(58) Field of Classification Search
CPC ......... H01L 21/02118; H01L 21/02271; H01L 21/31116; H01L 21/31138; H01L 21/76828; H01L 21/0337
See application file for complete search history.

(56) References Cited

U.S. PATENT DOCUMENTS

| | | | | |
|---|---|---|---|---|
| 2018/0158693 A1* | 6/2018 | Yatsuda | ............ | H01L 21/31111 |
| 2019/0181039 A1* | 6/2019 | Yatsuda | ............ | H01L 21/76814 |
| 2019/0363011 A1* | 11/2019 | Yamaguchi | ......... | H01L 21/3065 |
| 2020/0152478 A1* | 5/2020 | Lee | ................... | H01L 21/28088 |

FOREIGN PATENT DOCUMENTS

JP 2012-54307 3/2012

* cited by examiner

*Primary Examiner* — Jaehwan Oh
(74) *Attorney, Agent, or Firm* — Nath, Goldberg & Meyer; Jerald L. Meyer

(57) ABSTRACT

There is provided a method of manufacturing a semiconductor device, including: forming a polymer film, which is a film of a polymer having a urea bond generated by polymerization of plural types of monomers, around a plurality of structures provided on a substrate and including a first material; adjusting a shape of the polymer film; forming a temporary sealing film on the polymer film to cover the polymer film; and heating the polymer film to depolymerize the polymer into the plural types of monomers and desorb the plural types of depolymerized monomers through the temporary sealing film.

20 Claims, 16 Drawing Sheets

METHOD OF MANUFACTURING SEMICONDUCTOR DEVICE

CROSS-REFERENCE TO RELATED APPLICATION

This application is based upon and claims the benefit of priority from Japanese Patent Application No. 2018-178254, filed on Sep. 25, 2018, the entire contents of which are incorporated herein by reference.

TECHNICAL FIELD

Various aspects and embodiments of the present disclosure relate to a method of manufacturing a semiconductor device.

BACKGROUND

As a method of reducing the relative dielectric constant of an interlayer insulating film in a multi-layered semiconductor device, there is known a method of utilizing a void formed as an embedment failure when embedding a recess on a substrate with such an interlayer insulating film.

PRIOR ART DOCUMENT

Patent Document

Japanese Laid-Open Patent Publication No. 2012-54307

SUMMARY

According to one embodiment of the present disclosure, there is provided a method of manufacturing a semiconductor device including: forming a polymer film, which is a film of a polymer having a urea bond generated by polymerization of plural types of monomers, around a plurality of structures provided on a substrate and including a first material; adjusting a shape of the polymer film; forming a temporary sealing film on the polymer film to cover the polymer film and heating the polymer film to depolymerize the polymer into the plural types of monomers and desorb the plural types of depolymerized monomers through the temporary sealing film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a method of manufacturing a semiconductor device disclosed in the subject application will be described in detail with reference to the accompanying drawings. Note that the technique of the present disclosure is not limited by the embodiments described below. In addition, it should be noted that the drawings are schematic and further that the relationship between dimensions of respective elements, the proportions of respective elements, and the like may differ from real ones. Furthermore, even between the drawings, there may be portions where dimensional relationships and proportions differ from one another.

First Embodiment

[Method of Manufacturing Semiconductor Device]

Figure 1:
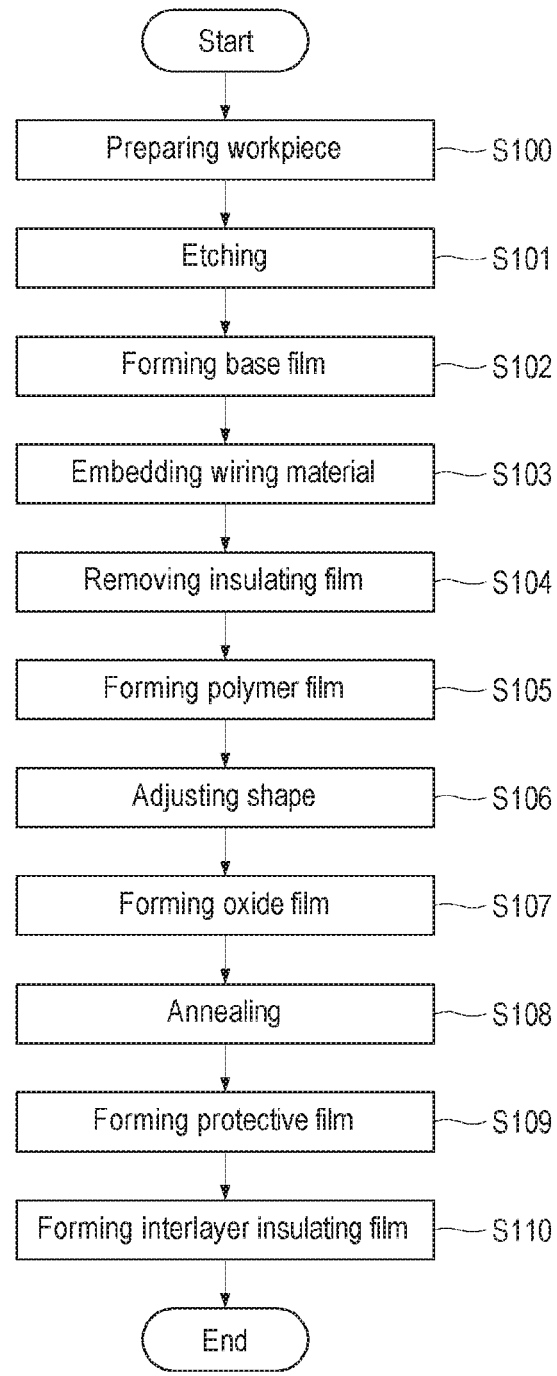
FIG. 1 is a flowchart showing an example of a method of manufacturing a semiconductor device according to a first embodiment of the present disclosure.

FIG. 1 is a flowchart showing an example of a method of manufacturing a semiconductor device according to a first embodiment of the present disclosure. FIGS. 2 to 6. FIGS. 8 to 10 and FIGS. 12 to 14 are sectional views showing examples of states of a workpiece (or object) W in respective steps.

Figure 2:
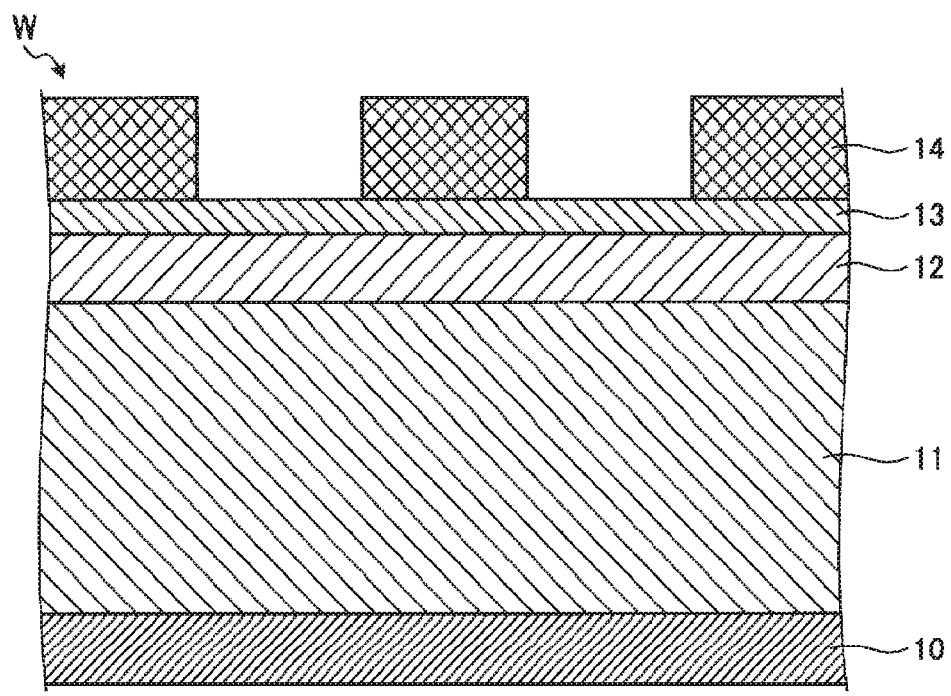
FIG. 2 is a sectional view showing an example of a workpiece.

First, for example, a workpiece W shown in FIG. 2 is prepared (S100). For example, as shown in FIG. 2, the workpiece W has a structure in which an insulating film 11, a hard mask film 12, an antireflection film 13 and a resist film 14 are stacked one above another in the named order on a base substrate 10. In the present embodiment, the base substrate 10 is made of, for example, nitrogen-added silicon carbide (SiCN), the insulating film 11 is made of, for example, silicon oxide ($SiO_2$), and the hard mask film 12 is made of, for example, titanium nitride (TiN). The base substrate 10 is an example of a substrate. The resist film 14 is formed in a predetermined pattern corresponding to the area in which the wiring material is to be embedded.

Figure 3:
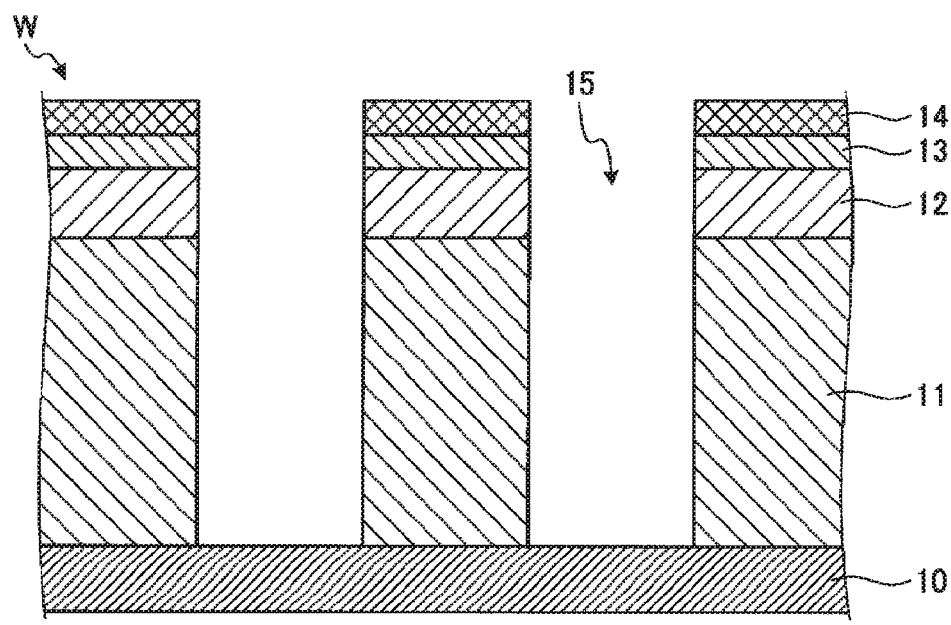
FIG. 3 is a sectional view showing an example of an etched workpiece.

Next, the workpiece W shown in FIG. 2 is loaded into an etching apparatus, and the antireflection film 13, the hard mask film 12 and the insulating film 11 are etched with, for example, plasma along the shape of the resist film 14 (S101). Thus, for example, as shown in FIG. 3, portions of the antireflection film 13, the hard mask film 12 and the insulating film 11, which are not covered with the resist film 14, are etched to form a recess 15. Then, the resist film 14 is removed by ashing.

Figure 4:
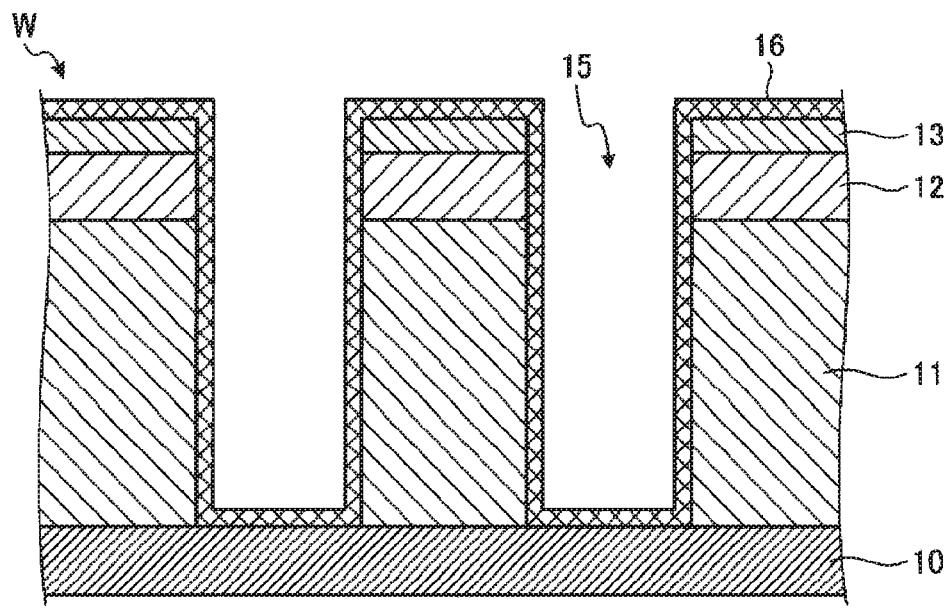
FIG. 4 is a sectional view showing an example of a workpiece on which a base film is stacked.

Next, a workpiece W subjected to etching is loaded into a film forming apparatus. For example, as shown in FIG. 4, a base film 16 including a barrier film and a seed film is formed on the surface of a workpiece W (S102). The base film 16 is stacked on the workpiece W by, for example, sputtering. The barrier film is made of, for example, titanium (Ti), titanium nitride (TiN) or the like, and the seed film is made of, for example, copper (Cu) or the like.

Figure 5:
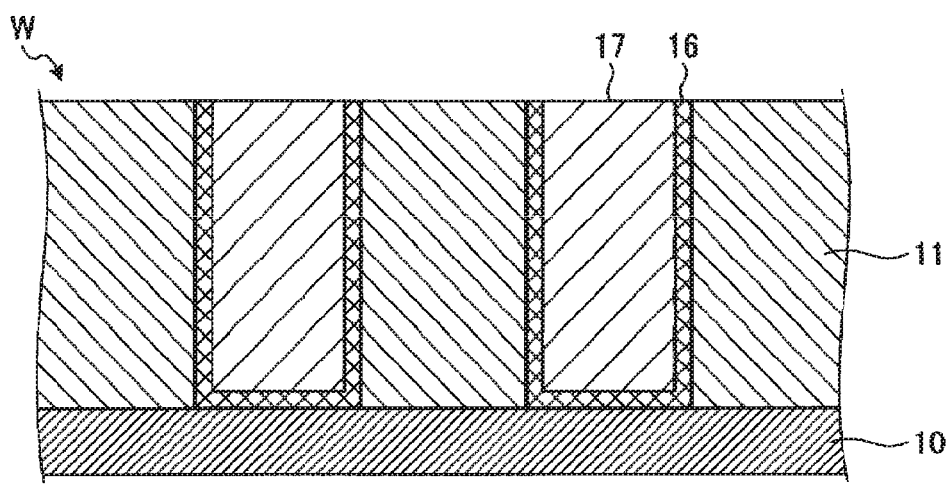
FIG. 5 is a sectional view showing an example of a workpiece in which a wiring material is embedded.

Next, the workpiece W on which the base film 16 is stacked is loaded into an embedding apparatus, and a wiring material 17 is embedded in the recess 15 of the workpiece W (S103). The wiring material 17 is an example of a first material having conductivity. In the present embodiment, the wiring material 17 is, for example, Cu. The wiring material 17 is embedded in the recess 15 by, for example, plating. Then, the upper surface of a workpiece W in which the wiring material 17 is embedded is polished by CMP (Chemical Mechanical Polishing). A workpiece W subjected to the embedment of the wiring material 17 and the polishing of the surface thereof has a cross section, for example, as shown in FIG. 5.

Figure 6:
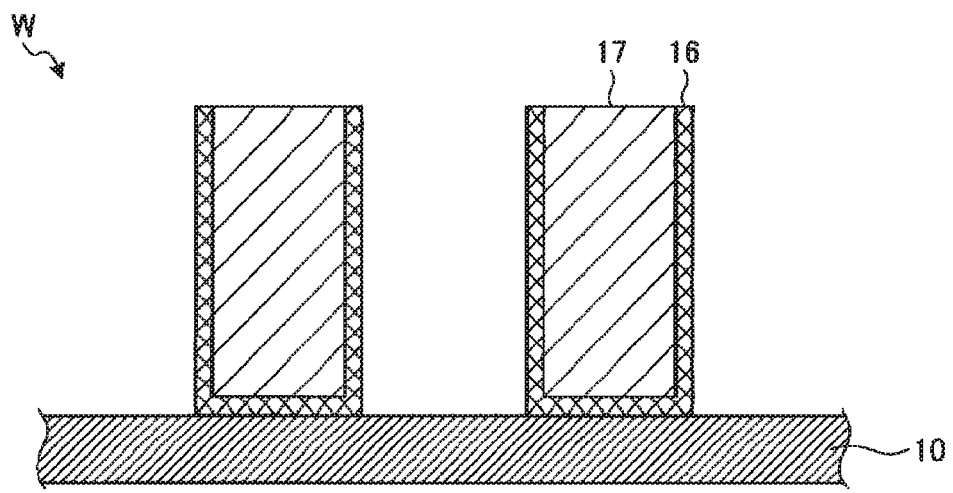
FIG. 6 is a sectional view showing an example of a workpiece from which an insulating film has been removed.

Next, the workpiece W is loaded into the etching apparatus, and the insulating film 11 is removed by etching (S104). The insulating film 11 of the workpiece W is removed by wet etching through the use of, for example, hydrofluoric acid (HF). A workpiece W subjected to removal of the insulating film 11 has a cross section, for example, as shown in FIG. 6. Thus, a plurality of structures including the wiring material 17 is formed on the base substrate 10. The wiring material 17 surrounded by the base film 16 is an example of a structure.

Figure 7:
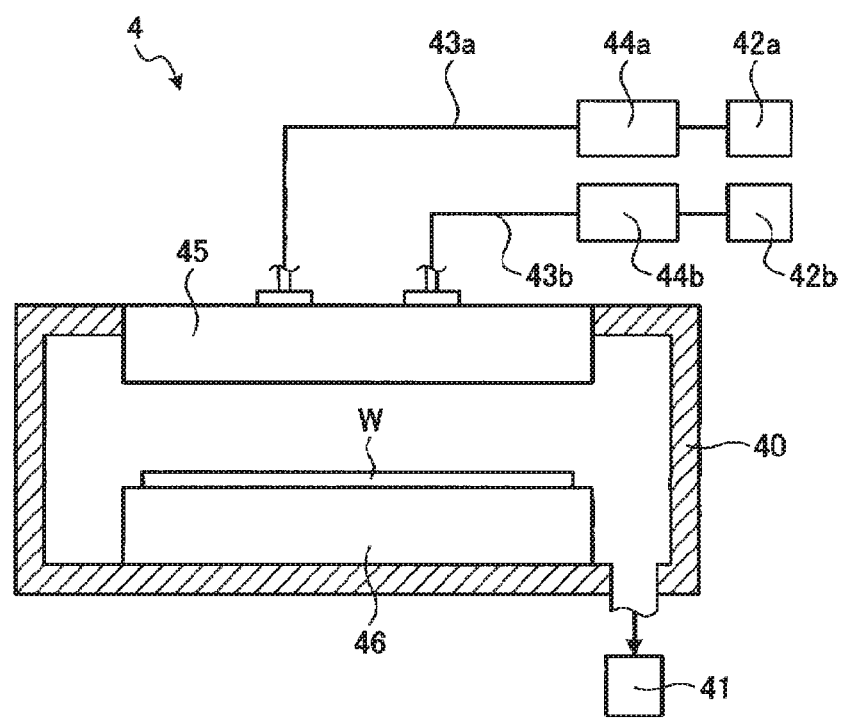
FIG. 7 is a schematic sectional view showing an example of a film forming apparatus for stacking a polymer film on a workpiece.

Next, the workpiece W from which the insulating film 11 has been removed is loaded into a film forming apparatus 4, and a polymer film 18 is stacked on the workpiece W (S105). Step S105 is an example of a first stacking step. FIG. 7 is a schematic sectional view showing an example of the film forming apparatus 4 for stacking the polymer film 18 on a workpiece W. In the present embodiment, the film forming apparatus 4 is, for example, a chemical vapor deposition (CVD) apparatus.

The film forming apparatus 4 includes a container 40 and an exhaust device 41. The exhaust device 41 exhausts a gas existing in the container 40. An inside of the container 40 is made into a predetermined vacuum atmosphere by the exhaust device 41.

A raw material supply source 42a for storing isocyanate as a raw material monomer in a liquid state is connected to the container 40 via a supply pipe 43a. Furthermore, a raw material supply source 42b for storing amine as a raw material monomer in a liquid state is connected to the container 40 via a supply pipe 43b. Isocyanate is an example of a first monomer, and amine is an example of a second monomer.

The liquid of isocyanate supplied from the raw material supply source 42a is vaporized by a vaporizer 44a provided in the supply pipe 43a. The vapor of isocyanate is introduced into a shower head 45 as a gas discharge part via the supply pipe 43a. The liquid of amine supplied from the raw material supply source 42b is vaporized by a vaporizer 44b provided in the supply pipe 43b. Then, the vapor of amine is introduced into the shower head 45.

The shower head 45 is provided, for example, on the upper portion of the container 40, and a large number of discharge holes are formed on the lower surface of the shower head 45. The shower head 45 discharges the vapor of isocyanate and the vapor of amine, which are introduced through the supply pipe 43a and the supply pipe 43b, from different discharge holes into the container 40 in a shower shape.

In the container 40, a mounting table 46 having a temperature control mechanism (not shown) is provided. A workpiece W is mounted on the mounting table 46. The mounting table 46 is controlled by the temperature control mechanism so that the temperature of the workpiece W becomes a predetermined temperature. When the polymer film 18 is stacked on the workpiece W, the mounting table 46 controls the temperature of the workpiece W to become a temperature suitable for vapor deposition polymerization of the raw material monomers supplied from the raw material supply source 42a and the raw material supply source 42b, respectively. The temperature suitable for vapor deposition polymerization may be determined according to the type of the raw material monomer and may be, for example, 40 degrees C. to 150 degrees C.

Figure 8:
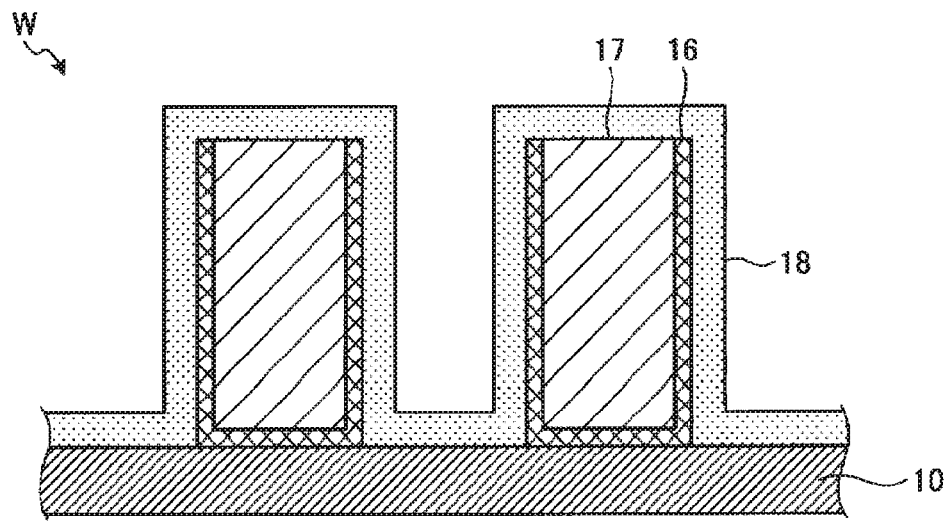
FIG. 8 is a sectional view showing an example of a workpiece on which a polymer film is stacked.

By causing a vapor deposition polymerization reaction of two types of raw material monomers to be generated on the surface of the workpiece W using such a film forming apparatus 4, for example, as shown in FIG. 8, it is possible to stack the polymer film 18 on the surface of the workpiece W. When the two types of raw material monomers are isocyanate and amine, the polymer film 18 of polyurea is stacked on the surface of the workpiece W.

Figure 9:
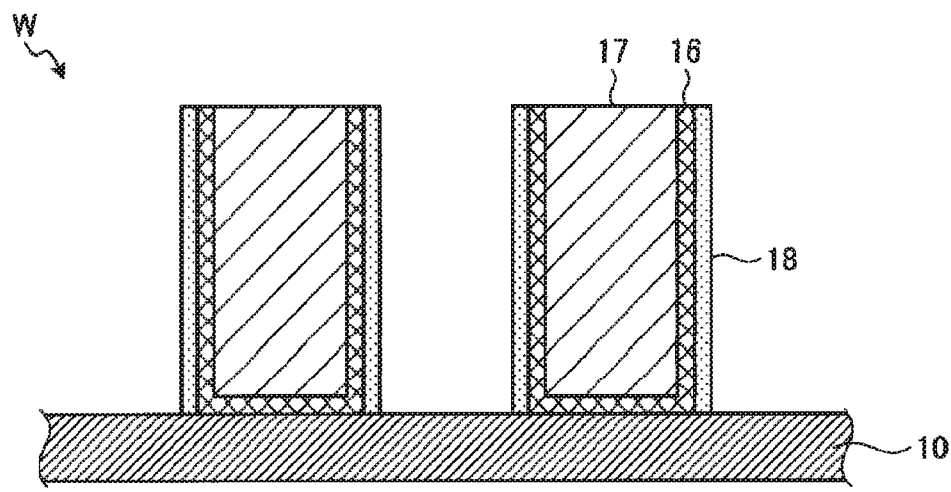
FIG. 9 is a sectional view showing an example of a workpiece in which the shape of a polymer film is adjusted.

Next, a workpiece W on which the polymer film 18 is stacked is loaded into an etching apparatus, and the shape of the polymer film 18 is adjusted (S106). In step S106, for example, the polymer film 18 is etched by anisotropic etching or the like using plasma to leave the polymer film 18 stacked on a side of the wiring material 17. Step S106 is an example of an adjustment step. Thus, the workpiece W has a shape, for example, as shown in FIG. 9. By adjusting the etching conditions, it is possible to control the thickness of the polymer film 18 left on the side of the wiring material 17.

Figure 10:
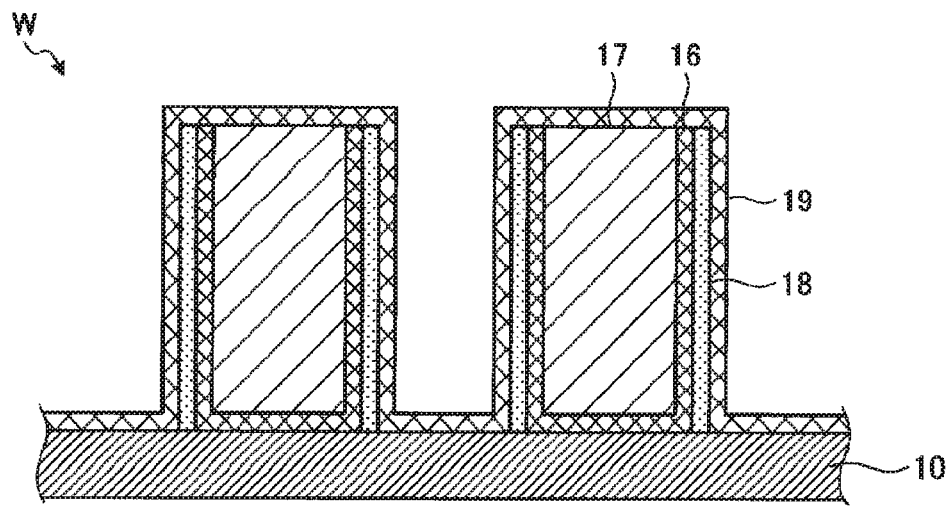
FIG. 10 is a sectional view showing an example of a workpiece on which an oxide film is stacked.

Next, a workpiece W in which the shape of the polymer film 18 is adjusted is loaded into a film forming apparatus, and an oxide film 19 is formed on the workpiece W, for example, as shown in FIG. 10 (S107). Step S107 is an example of a second stacking step. The oxide film 19 is stacked on the workpiece W by, for example, ALD (Atomic Layer Deposition). In the present embodiment, the oxide film 19 is a low-temperature oxide film (LTO film) made of $SiO_2$ and is a film which is sparser than a thermal oxide film formed at a high temperature. The oxide film 19 is an example of a temporary sealing film.

Figure 11:
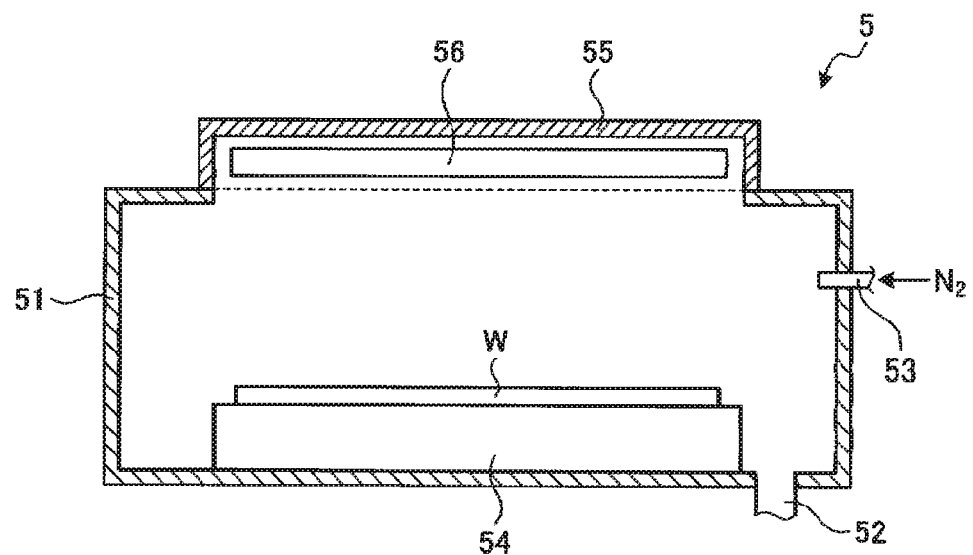
FIG. 11 is a schematic sectional view showing an example of an annealing apparatus.

Next, the workpiece W on which the oxide film 19 is stacked is loaded into an annealing apparatus 5 and is annealed (S108). Step S108 is an example of a heating step. FIG. 11 is a schematic sectional view showing an example of the annealing apparatus 5. The annealing apparatus 5 includes a container 51 and an exhaust pipe 52. An inert gas is supplied into the container 51 through a supply pipe 53. In the present embodiment, the inert gas is, for example, a nitrogen ($N_2$) gas. The gas in the container 51 is exhausted from the exhaust pipe 52. In the present embodiment, an inside of the container 51 is an atmospheric pressure atmosphere. In another embodiment, the inside of the container 51 may be a vacuum atmosphere.

In the container 51, a mounting table 54 on which a workpiece W is mounted is provided. A lamp house 55 is provided at a position facing the surface of the mounting table 54 on which the workpiece W is mounted. An infrared lamp 56 is disposed in the lamp house 55.

Figure 12:
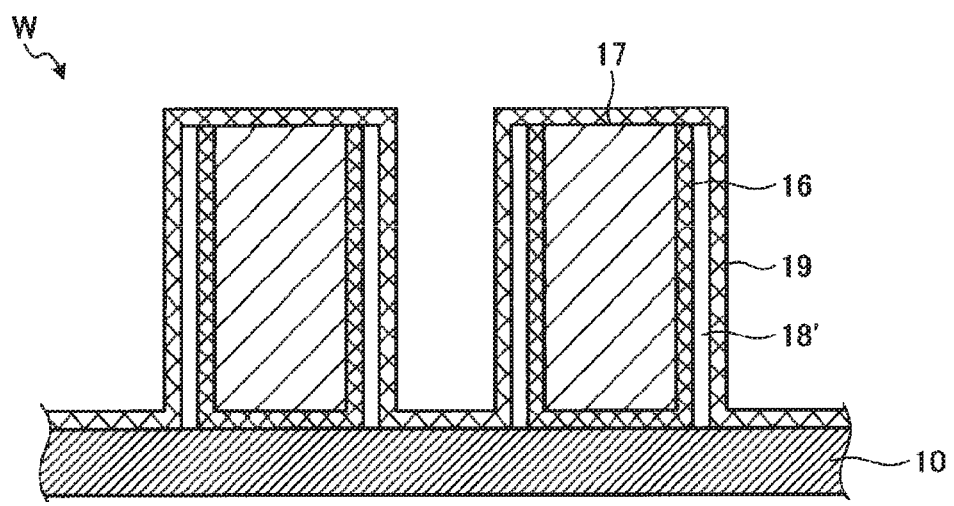
FIG. 12 is a sectional view showing an example of a workpiece from which a polymer film has been removed.

In a state in which the workpiece W is mounted on the mounting table 54, the inert gas is supplied into the container 51. Then, the workpiece W is heated by turning on the infrared lamp 56. When the polymer film 18 formed on the workpiece W reaches a temperature at which a depolymerization reaction is generated, the polymer film 18 is depolymerized into two types of raw material monomers. In the present embodiment, since the polymer film 18 is made of polyurea, the polymer film 18 is depolymerized into isocyanate and amine as raw material monomers by heating the workpiece W to 300 degrees C. or higher, for example, 350 degrees C. Then, the isocyanate and the amine generated by the depolymerization pass through the oxide film 19 which is a sparse film, thereby being desorbed from between the oxide film 19 and the base film 16. Thus, for example, as shown in FIG. 12, a void 18' is created on the side of the wiring material 17 and between the base film 16 and the oxide film 19.

Figure 13:
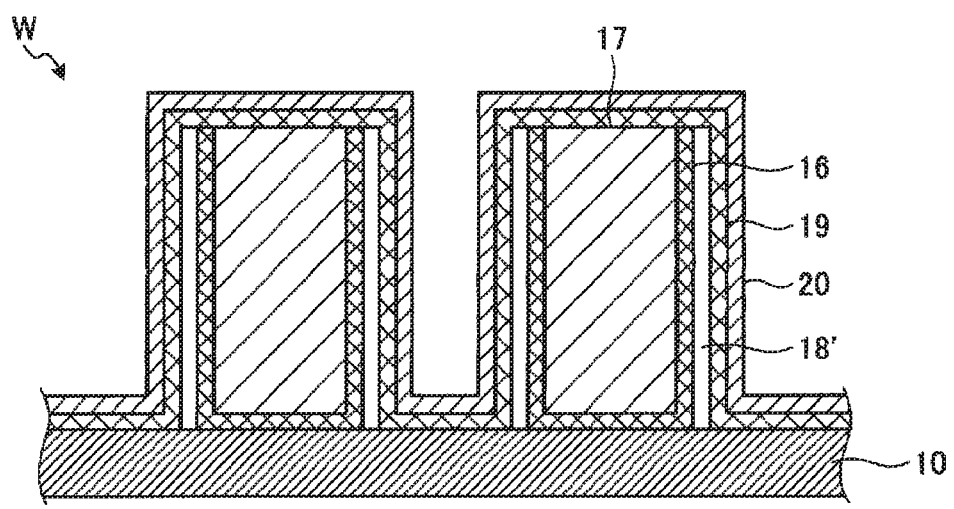
FIG. 13 is a sectional view showing an example of a workpiece on which a protective film is stacked.

Next, a workpiece W subjected to the annealing is loaded into a film forming apparatus, and a protective film 20 is formed on the workpiece W, for example, as shown in FIG. 13 (S109). Step S109 is an example of a third stacking step. The protective film 20 is, for example, a passivation film such as a silicon nitride (SiN) film or the like.

Figure 14:
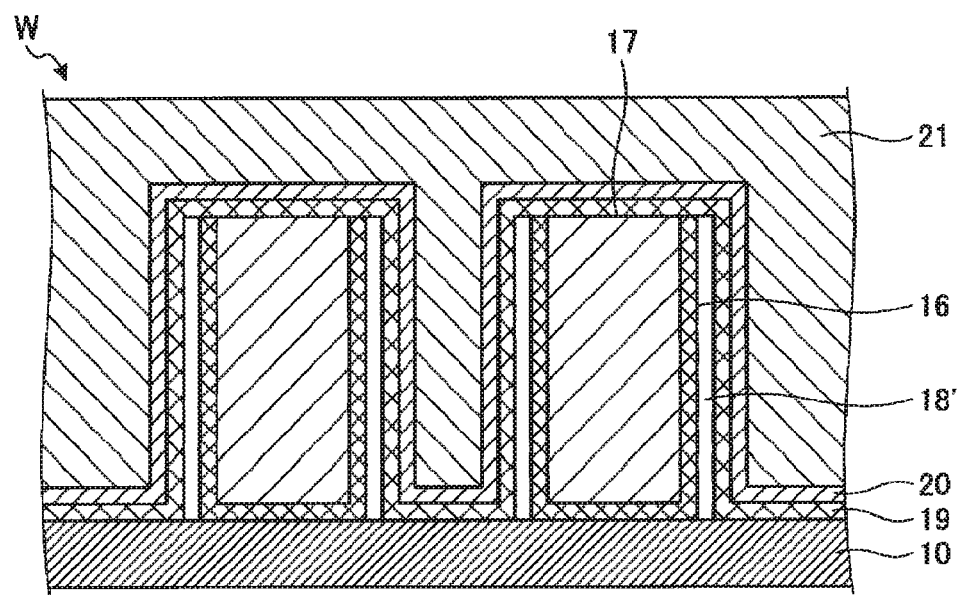
FIG. 14 is a sectional view showing an example of a workpiece on which an interlayer insulating film is stacked.

Next, for example, as shown in FIG. 14, an interlayer insulating film 21 is formed on a workpiece W on which the protective film 20 is stacked (S110). Step S110 is an example of an embedment step. The interlayer insulating film 21 is made of, for example, $SiO_2$. The interlayer insulating film 21 is an example of a member made of a second material having an insulating property. For example, a part of a workpiece W shown in FIG. 14 constitutes a part of the semiconductor device.

As apparent from FIG. 14, in a workpiece W of the present embodiment, the void 18' corresponding to the shape of the polymer film 18 is created on the side of the wiring material 17. Thus, a relative dielectric constant of members around the wiring material 17 can be reduced to a desired value. This makes it possible to reduce a parasitic capacitance of the wiring formed by the wiring material 17.

Figure 15:
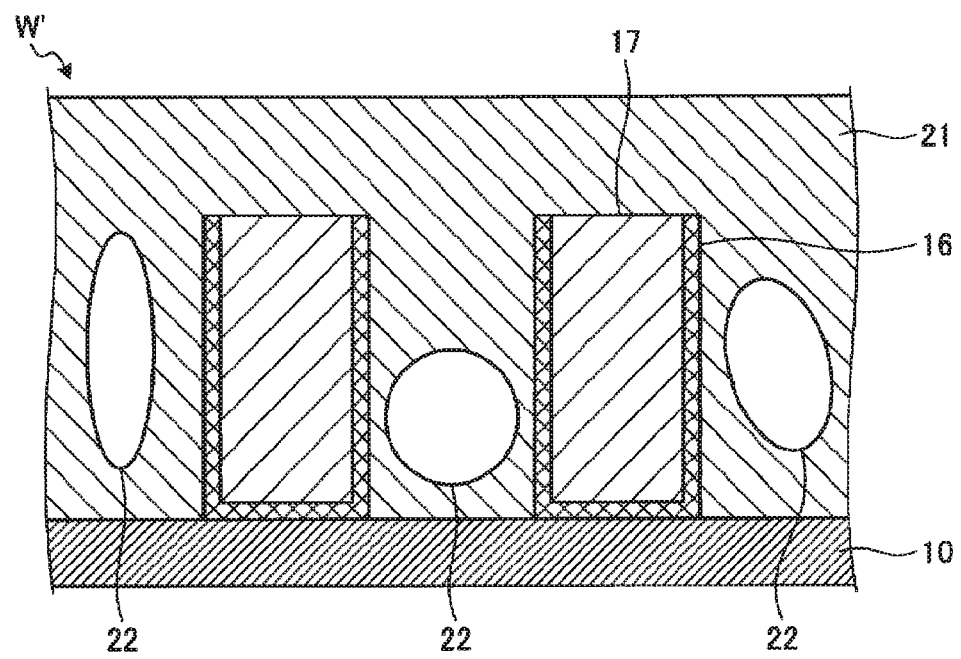
FIG. 15 is a sectional view showing an example of a workpiece in a comparative example.

Herein, for example, the interlayer insulating film 21 may be intentionally stacked on a workpiece W from which the insulating film 11 has been removed as shown in FIG. 6, under a condition that a step coverage is deteriorated. Thus, for example, as shown in FIG. 15, it is also possible to create a void 22 on the side of the wiring material 17. FIG. 15 is a sectional view showing an example of workpiece W' according to a comparative example.

However, a shape and size of the void 22 formed by the interlayer insulating film 21 stacked under the condition that the step coverage is deteriorated depends on the width and depth of a recess in which the void 22 is created. For example, if the recess is narrow and deep, a large void 22 is created in the recess. However, if the recess is wide and shallow, a small void 22 may be created or no void 22 may be created in a lower part of the recess.

For example, as shown in FIG. 15, the shape and size of the void 22 created in the recess may vary depending on a position of the recess on the workpiece W' or a position of the recess in the film forming apparatus for forming the interlayer insulating film 21. Furthermore, even if the position of the recess on the workpiece W' and the position of the recess in the film forming apparatus are the same, the shape and size of the void 22 created in the recess may vary from workpiece W' to workpiece W'. Therefore, it is difficult to stably create the void 22 having a desired shape and size in the recess having an arbitrary shape.

On the other hand, in the present embodiment, a shape of the polymer film 18 is adjusted to have a shape corresponding to a desired shape of the void 18' (see FIG. 9). Then, after the oxide film 19 is stacked, the polymer film 18 is removed (see FIG. 12). Thus, by adjusting the shape of the polymer film 18, it is possible to create the void 18' having an arbitrary shape in a recess without depending on the width and depth of the recess. Therefore, according to the method for manufacturing a semiconductor device of the present embodiment, the void 18' having an arbitrary shape set in consideration of the electrical characteristics and the mechanical strength can be created in the recess of the workpiece W.

The method of manufacturing a semiconductor device according to the first embodiment has been described above. The manufacturing method according to the present embodiment includes a first stacking step S105, an adjustment step S106, a second stacking step S107 and a heating step S108. In the first stacking step, the polymer film 18 which is a film of a polymer having a urea bond generated by polymerization of plural types of monomers (isocyanate and amine) is formed around the plurality of structures 16, 17 provided on the substrate 10 and including the first material. In the adjustment step, the shape of the polymer film is adjusted. In the second stacking step, the temporary sealing film 19 is stacked on the polymer film to cover the polymer film. In the heating step, by heating the polymer film, the polymer film is depolymerized into plural types of monomers, and the plural types of depolymerized monomers are desorbed through the temporary sealing film. Thus, it is possible to create a void having an arbitrary shape around the structures.

Furthermore, in the adjustment step according to the above-described embodiment, the shape of the polymer film is adjusted by etching so that the polymer film is disposed on the side of each of the structures 16, 17. Thus, it is possible to easily adjust the shape of the polymer film.

In addition, the manufacturing method according to the above-described embodiment further includes a third stacking step S109 performed after the heating step and an embedment step S110. In the third stacking step, the protective film 20 is stacked on the temporary sealing film to cover the temporary sealing film. In the embedment step, the member 21 made of the second material is embedded on the protective film and between adjacent structures. Thus, it is possible to manufacture a semiconductor device in which the member made of the second material is disposed between the structures.

In the embodiment described above, the first material is a conductive material, and the second material is an insulating material. Thus, a void having an arbitrary shape can be created on a side of a structure including a conductive material which functions as a wiring of a semiconductor device. The void having an arbitrary shape set in consideration of an electrical characteristics and a mechanical strength can be formed on the side of a structure.

In the first stacking step according to the above-described embodiment, a gas containing the first monomer (isocyanate) and a gas containing the second monomer (amine) are supplied into the container 40 in which the substrate is accommodated. Then, the polymer film (polyurea) produced by vapor deposition polymerization of the first monomer and the second monomer is stacked around the plurality of structures. Thus, it is possible to easily stack the polymer film around the plurality of structures.

In the above-described embodiment, the first stacking step is performed at a temperature lower than that of the heating step. Thus, the polymer film can be formed around the plurality of structures, and the polymer film can be removed from around the plurality of structures by depolymerizing the polymer film in the heating step.

Second Embodiment

In the first embodiment, after the plurality of structures including the wiring material 17 is formed, the void 18' is created on the side of each of the structures, and the interlayer insulating film 21 is embedded between the respective structures. On the other hand, in the present embodiment, after a plurality of structures formed of insulating members is formed, a void is created on a side of each of the structures, and a wiring material 17 is embedded between the respective structures. In this respect, the present embodiment differs from the first embodiment.

[Method of Manufacturing Semiconductor Device]

Figure 16:
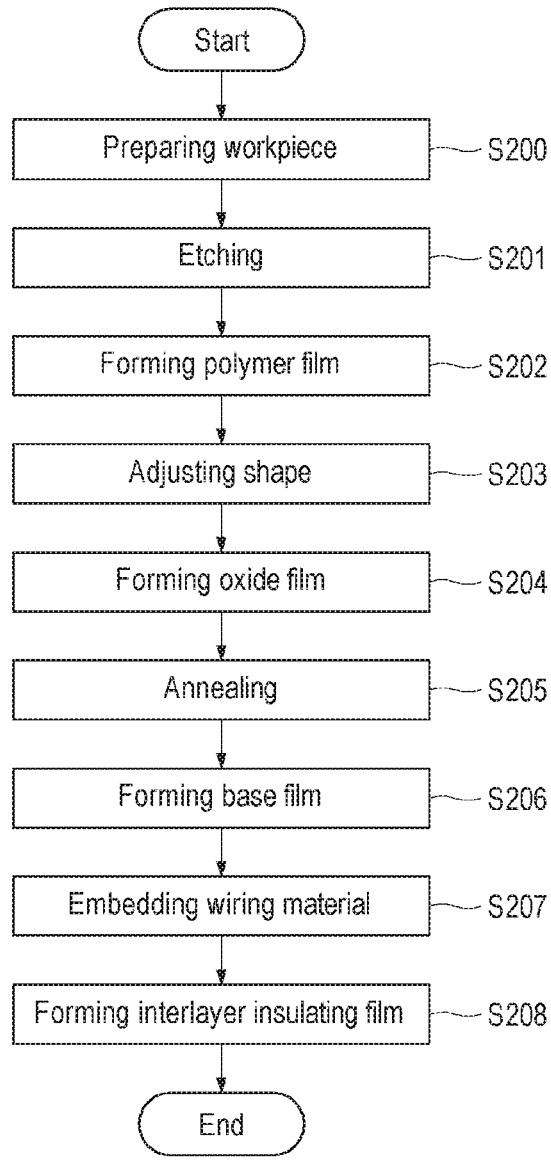
FIG. 16 is a flowchart showing an example of a method of manufacturing a semiconductor device according to a second embodiment of the present disclosure.

FIG. 16 is a flowchart showing an example of a method of manufacturing a semiconductor device according to the second embodiment of the present disclosure. FIGS. 17 to 23 are sectional views showing examples of states of a workpiece W in the respective steps included in the manufacturing method of the present embodiment. In the following description, FIGS. 2 and 3 are also referred to. Moreover, in the following description, the same content as that of the first embodiment will not be repeatedly described.

First, for example, a workpiece W shown in FIG. 2 is prepared (S200). Then, the workpiece W shown in FIG. 2 is loaded into the etching apparatus. For example, as shown in FIG. 3, the antireflection film 13, the hard mask film 12 and the insulating film 11 are etched along a shape of the resist film 14 (S201). Then, the resist film 14 is removed by ashing. Thus, a plurality of structures including the insulating film 11, the hard mask film 12 and the antireflection film 13 is formed on the base substrate 10. In the present embodiment, the insulating film 11 is an example of a first material having an insulating property.

Figure 17:
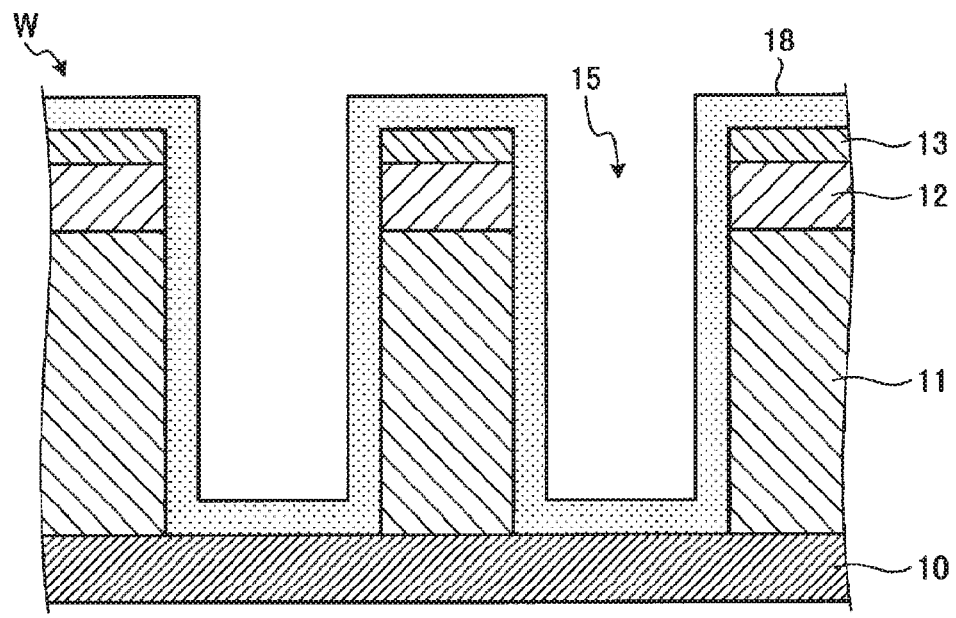
FIG. 17 is a sectional view showing an example of a workpiece on which a polymer film is stacked.

Next, a workpiece W etched along the shape of the resist film 14 is loaded into, for example, the container 40 of the film forming apparatus 4 shown in FIG. 7, and a polymer film 18 is formed on the workpiece W (S202). Thus, for example, as shown in FIG. 17, the polymer film 18 is stacked on the plurality of structures including the insulating film 11, the hard mask film 12 and the antireflection film 13.

Figure 18:
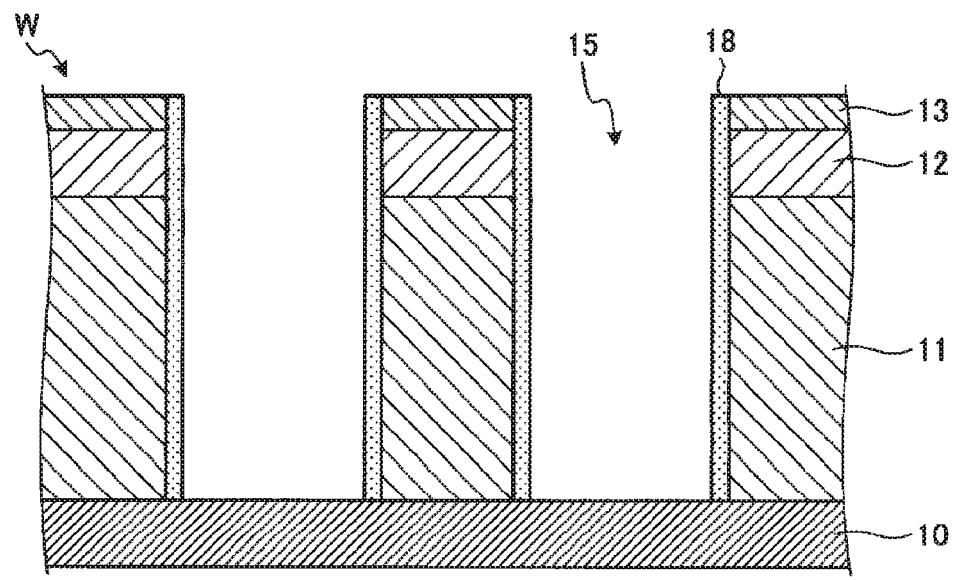
FIG. 18 is a sectional view showing an example of a workpiece in which the shape of a polymer film is adjusted.

Next, a workpiece W on which the polymer film 18 is stacked is loaded into the etching apparatus, and a shape of the polymer film 18 is adjusted (S203). For example, as shown in FIG. 18, the polymer film 18 is etched by anisotropic etching to leave the polymer film 18 stacked on the side of the respective structures including the insulating film 11, the hard mask film 12 and the antireflection film 13. By adjusting a conditions of the etching, it is possible to control a thickness of the polymer film 18 left on the side of each of the structures including the insulating film 11, the hard mask film 12 and the antireflection film 13.

Figure 19:
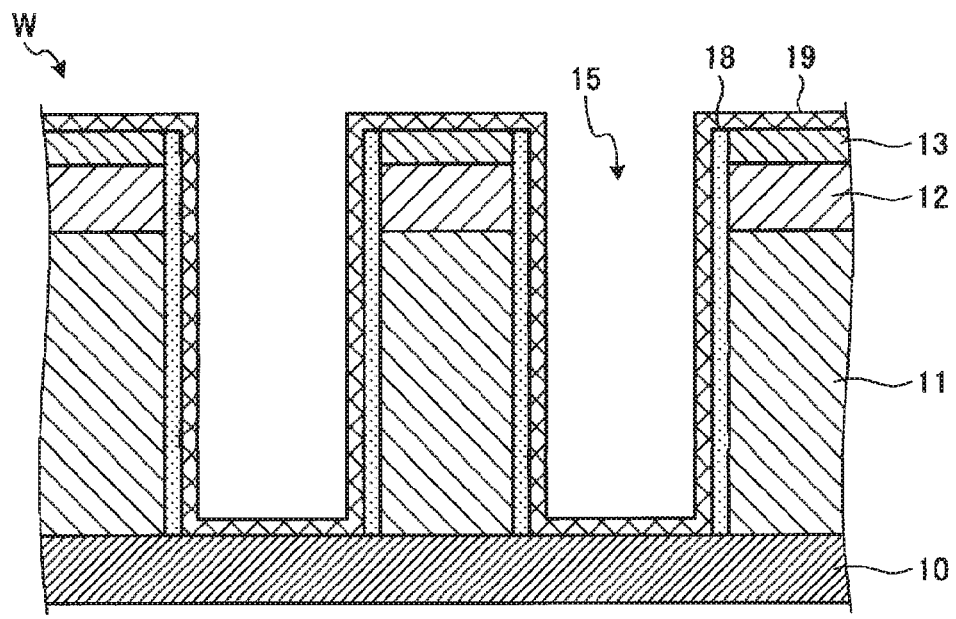
FIG. 19 is a sectional view showing an example of a workpiece on which an oxide film is stacked.

Next, a workpiece W in which the shape of the polymer film 18 has been adjusted is loaded into the film forming apparatus. For example, as shown in FIG. 19, an oxide film 19 is formed on the workpiece W (S204).

Figure 20:
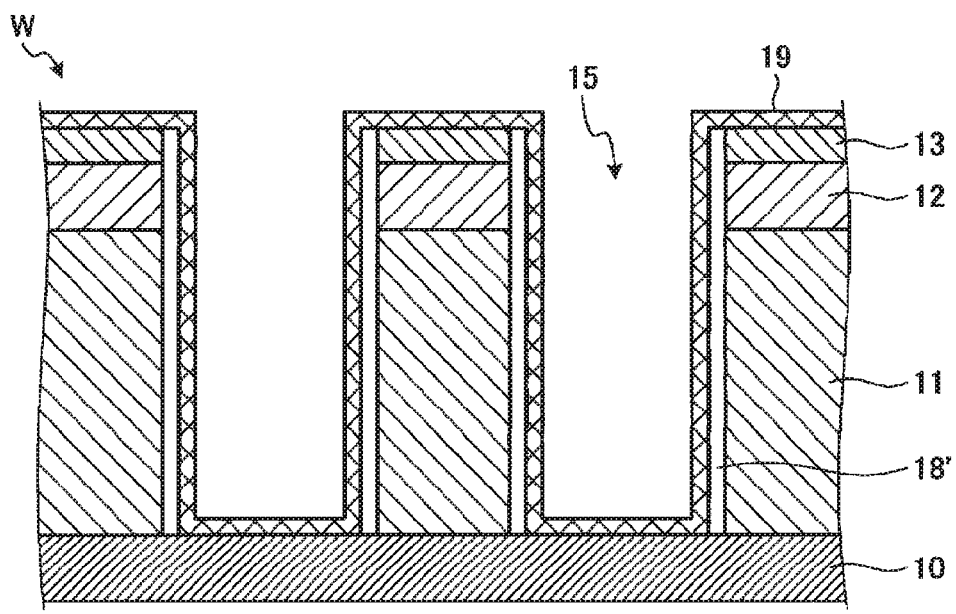
FIG. 20 is a sectional view showing an example of a workpiece from which a polymer film has been removed.

Next, a workpiece W on which the oxide film 19 is stacked is loaded into, for example, the annealing apparatus 5 shown in FIG. 11 and is annealed (S205). Thus, the polymer film 18 is depolymerized into raw material monomers, and the raw material monomers are desorbed through the oxide film 19. Thus, for example, as shown in FIG. 20, a void 18' corresponding to the shape of the polymer film 18 is created on the side of each of the structures including the insulating film 11, the hard mask film 12 and the antireflection film 13.

Figure 21:
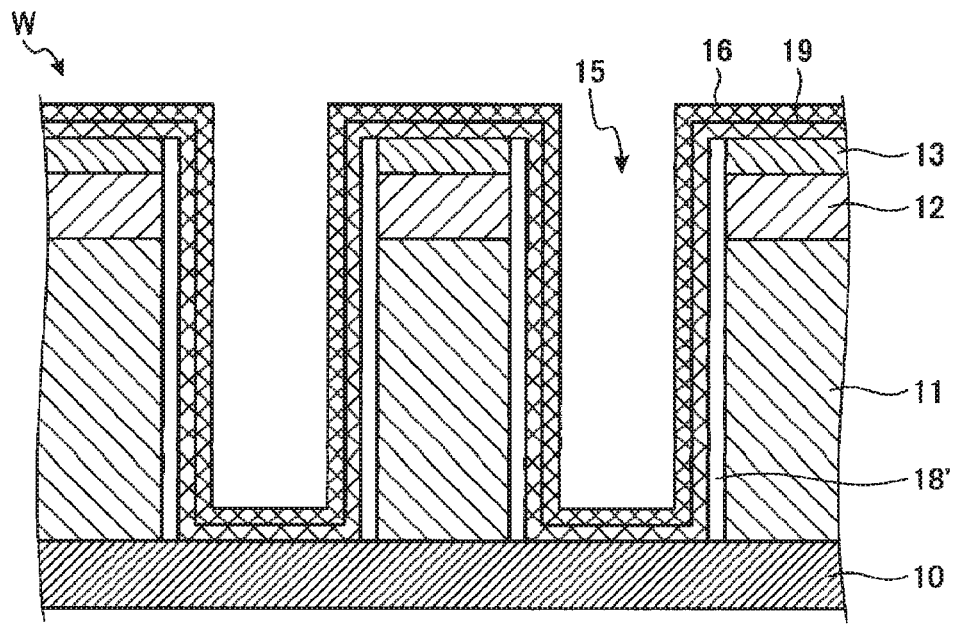
FIG. 21 is a sectional view showing an example of a workpiece on which a base film is stacked.

Next, a workpiece W subjected to the annealing is loaded into the film forming apparatus. For example, as shown in FIG. 21, a base film 16 including a barrier film and a seed film is formed on the workpiece W (S206).

Figure 22:
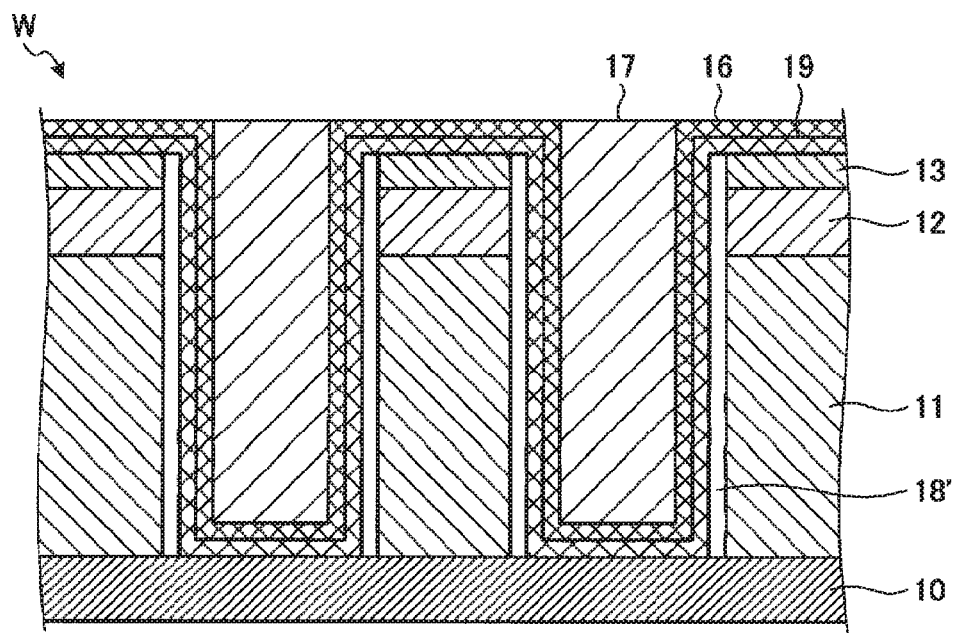
FIG. 22 is a sectional view showing an example of a workpiece in which a wiring material is embedded.

Next, a workpiece W on which the base film 16 is stacked is loaded into the embedding apparatus, and a wiring material 17 is embedded in a recess 15 of the workpiece W (S207). In the present embodiment, the wiring material 17 is an example of a second material having conductivity. Then, an upper surface of a workpiece W in which the wiring material 17 is embedded is polished by CMP. A workpiece W subjected to the embedment of the wiring material 17 and the polishing of the surface thereof has a cross section, for example, as shown in FIG. 22.

Figure 23:
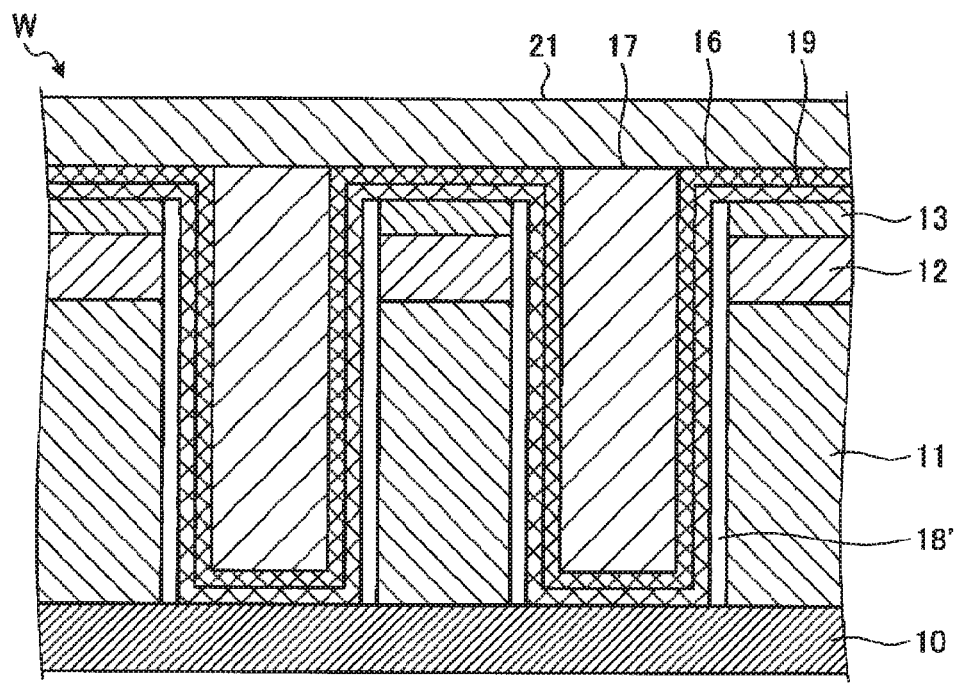
FIG. 23 is a sectional view showing an example of a workpiece on which an interlayer insulating film is stacked.

Next, the workpiece W in which the wiring material 17 is embedded is loaded into the film forming apparatus. For example, as shown in FIG. 23, an interlayer insulating film 21 is formed on the workpiece W (S208). For example, a part of a workpiece W shown in FIG. 23 constitutes a part of the semiconductor device.

The method of manufacturing a semiconductor device according to the second embodiment has been described above. Also in the manufacturing method of the present embodiment, by adjusting the shape of the polymer film 18, it is possible to create the void 18' having an arbitrary shape on the side of the wiring material 17. Therefore, according to the manufacturing method of the present embodiment, the void 18' having an arbitrary shape set in consideration of an electrical characteristics and a mechanical strength can be formed on the side of the wiring material 17.

Furthermore, in the present embodiment, the structures disposed around the wiring material 17 are formed first, and the wiring material 17 is embedded between the structures thus formed. Thus, it is possible to omit the step of removing the insulating film 11 (step S104 in FIG. 1). This makes it possible to more quickly manufacture a semiconductor device.

Third Embodiment

In each of the above-described embodiments, the void 18' corresponding to the shape of the polymer film 18 is created on a side of the wiring material 17. On the other hand, according to the present embodiment, in a structure having a source, a drain and a gate, a void 18' corresponding to a shape of the polymer film 18 is created above the gate. Hereinafter, an example of a method of manufacturing a semiconductor device according to the present embodiment will be described with reference to FIGS. 24 to 29.

Figure 24:
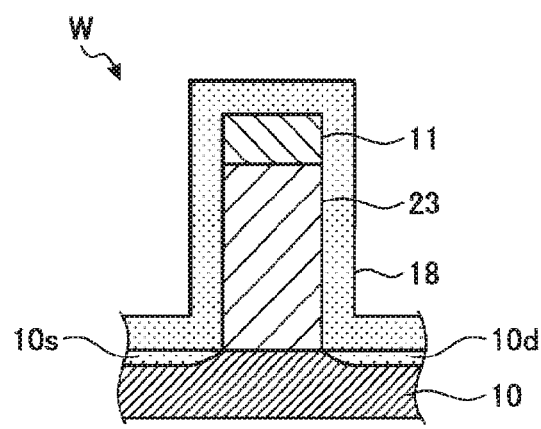
FIG. 24 is a sectional view showing an example of a workpiece on which a polymer film is stacked.

First, in a workpiece W, a gate silicon film 23 doped with a predetermined material is stacked on a base substrate 10 on which a source region 10s and a drain region 10d are formed. An insulating film 11 is stacked on the gate silicon film 23. The gate silicon film 23 is an example of a structure made of a semi-conductive material. Then, the insulating film 11 and the gate silicon film 23 are formed into a predetermined shape by anisotropic etching. Then, the workpiece W is loaded into, for example, the container 40 of the film forming apparatus 4 shown in FIG. 7. Then, for example, as shown in FIG. 24, a polymer film 18 is stacked on the workpiece W.

Figure 25:
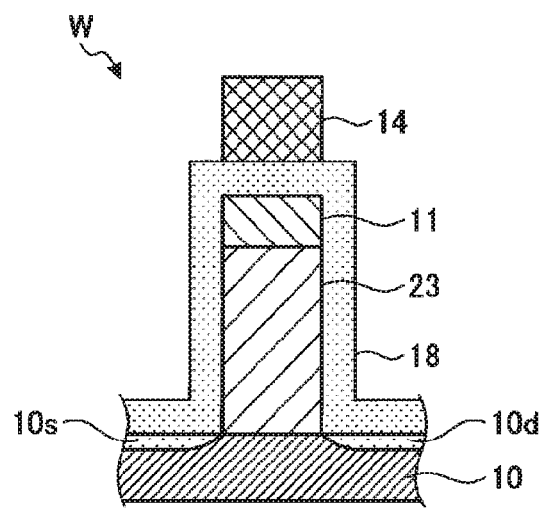
FIG. 25 is a sectional view showing an example of a workpiece on which a resist film is formed.
Figure 26:
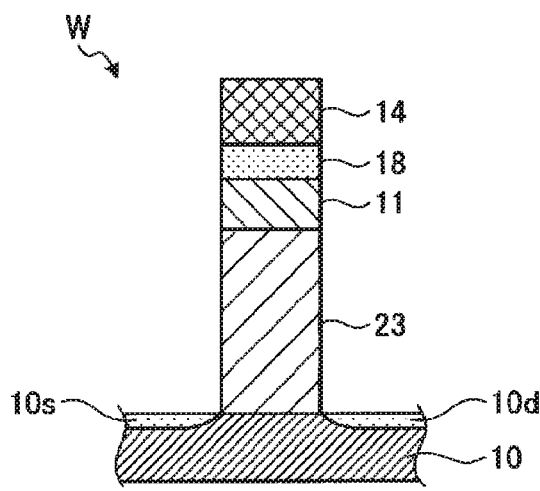
FIG. 26 is a sectional view showing an example of a workpiece in which the shape of a polymer film is adjusted.
Figure 27:
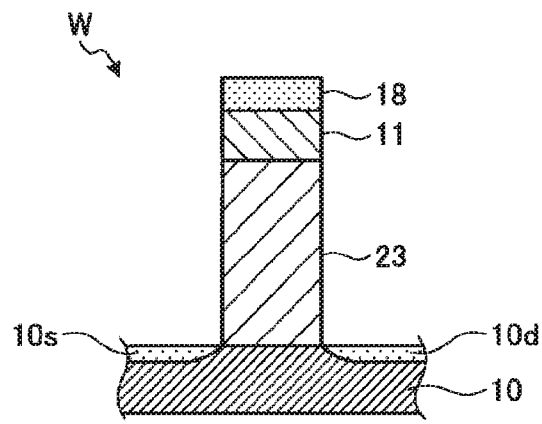
FIG. 27 is a sectional view showing an example of a workpiece from which a resist film has been removed.

Next, in a workpiece W on which the polymer film 18 is stacked, for example, as shown in FIG. 25, a resist film 14 is stacked on the polymer film 18. A shape of the resist film 14 is adjusted to leave the polymer film 18 above the gate silicon film 23. Then, by virtue of anisotropic etching, the polymer film 18 is etched using the resist film 14 as a mask, whereby a shape of the polymer film 18 is adjusted, for example, as shown in FIG. 26. Then, for example, as shown in FIG. 27, the resist film 14 on the polymer film 18 is removed.

Figure 28:
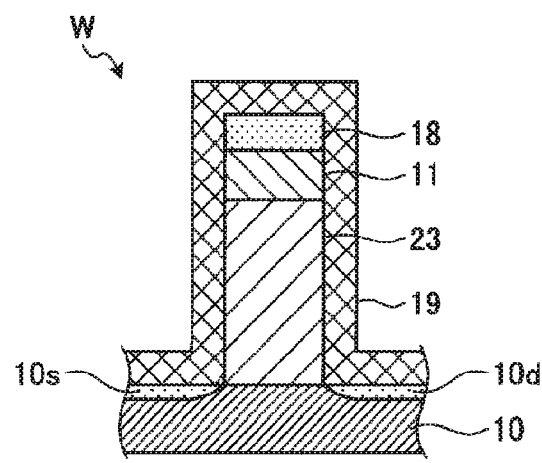
FIG. 28 is a sectional view showing an example of a workpiece on which an oxide film is stacked.

Next, a workpiece W in which the shape of the polymer film 18 is adjusted is loaded into the film forming apparatus. For example, as shown in FIG. 28, an oxide film 19 is stacked on the workpiece W.

Figure 29:
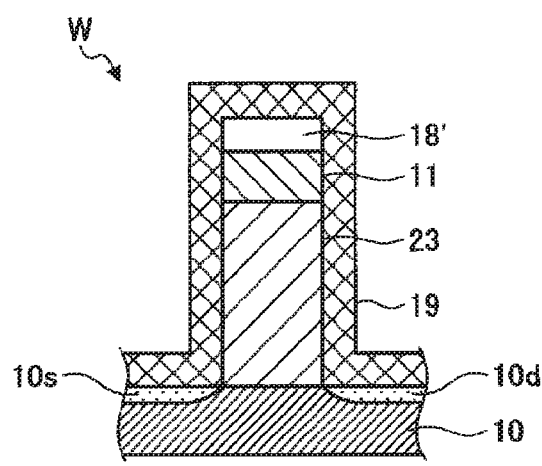
FIG. 29 is a sectional view showing an example of a workpiece from which a polymer film has been removed.

Next, a workpiece W on which the oxide film 19 is stacked is loaded into, for example, the annealing apparatus 5 shown in FIG. 11. Thus, the polymer film 18 is depolymerized into raw material monomers, and the raw material monomers are desorbed through the oxide film 19. As a result, for example, as shown in FIG. 29, a void 18' corresponding to the shape of the polymer film 18 is created above the insulating film 11.

The method of manufacturing a semiconductor device according to the third embodiment has been described above. According to the manufacturing method of the present embodiment, by adjusting the shape of the polymer film 18, it is possible to create the void 18' having an arbitrary shape above the gate silicon film 23.

[Others]

The technique disclosed herein is not limited to the above-described embodiments, and various modifications may be made within the scope of the present disclosure.

For example, in each of the above-described embodiments, the polymer film 18 is stacked by vapor deposition polymerization using vapors of two types of raw material monomers. However, the technique disclosed herein is not limited thereto. For example, the polymer film 18 may be stacked on a workpiece W by applying a liquid polymer on the workpiece W.

Moreover, in each of the above-mentioned embodiments, polyurea is used as an example of the polymer constituting the polymer film 18. However, polymers other than polyurea may be used. Examples of the polymers other than polyurea include polyurethane and the like which have a urethane bond. The polyurethane can be synthesized, for example, by copolymerizing a monomer having an alcohol group and a monomer having an isocyanate group. Furthermore, the polyurethane is depolymerized into a monomer having an alcohol group and a monomer having an isocyanate group by being heated to a predetermined temperature.

In each of the above-described embodiments, the oxide film 19 which is a low-temperature oxide film made of $SiO_2$ has been described as an example of the temporary sealing film for sealing the polymer film 18. However, in addition to the low-temperature oxide film of silicon, a low-temperature nitride film of silicon may be used as the temporary sealing film. The low-temperature nitride film is, for example, a film which is formed at a low temperature (for example, about 100 degrees C.) by plasma CVD or the like and which is sparser than a silicon nitride film formed at a high temperature (several hundred degrees C.). The low-temperature nitride film may be a silicon nitride film which has a stoichiometry value close to that of the low-temperature oxide film and which has a mechanical strength equal to or higher than that of the low-temperature oxide film. In addition, the temporary sealing film may be a porous film such as a carbon-added silicon oxide film (SiOC) or a polyimide film, as long as the temporary sealing film is a film through which the depolymerized monomers can pass.

According to various aspects and embodiments of the present disclosure, it is possible to form a void having a desired shape and size in a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

forming a polymer film, which is a film of a polymer having a urea bond generated by polymerization of plural types of monomers, around a plurality of structures provided on a substrate and including a first material;

adjusting a shape of the polymer film;

forming a temporary sealing film on the polymer film to cover the polymer film; and heating the polymer film to depolymerize the polymer into the plural types of monomers and desorb the plural types of depolymerized monomers through the temporary sealing film.

2. The method of claim 1, wherein in the adjusting, the shape of the polymer film is adjusted by etching so that the polymer film is disposed on a side of each of the structures.

3. The method of claim 2, further comprising:
forming a protective film on the temporary sealing film to cover the temporary sealing film after the heating; and
embedding a member including a second material on the protective film and between the structures adjacent to each other.

4. The method of claim 3, wherein the first material is a conductive or semi-conductive material, and the second material is an insulating material.

5. The method of claim 4, wherein in the forming the polymer film, a gas containing a first monomer and a gas containing a second monomer are supplied into a container in which the substrate is accommodated, and the polymer film produced by vapor deposition polymerization of the first monomer and the second monomer is formed around the plurality of structures.

6. The method of claim 5, wherein the forming the polymer film is performed at a lower temperature than the heating the polymer film.

7. The method of claim 6, wherein the temporary sealing film is an oxide film or a nitride film.

8. The method of claim 3, wherein the first material is an insulating material, and the second material is a conductive or semi-conductive material.

9. The method of claim 8, wherein in the forming the polymer film, a gas containing a first monomer and a gas containing a second monomer are supplied into a container in which the substrate is accommodated, and the polymer film produced by vapor deposition polymerization of the first monomer and the second monomer is formed around the plurality of structures.

10. The method of claim 9, wherein the forming the polymer film is performed at a lower temperature than the heating the polymer film.

11. The method of claim 10, wherein the temporary sealing film is an oxide film or a nitride film.

12. The method of claim 2, wherein in the forming the polymer film, a gas containing a first monomer and a gas containing a second monomer are supplied into a container in which the substrate is accommodated, and the polymer film produced by vapor deposition polymerization of the first monomer and the second monomer is formed around the plurality of structures.

13. The method of claim 2, wherein the forming the polymer film is performed at a lower temperature than the heating the polymer film.

14. The method of claim 1, further comprising:
forming a protective film on the temporary sealing film to cover the temporary sealing film after the heating; and
embedding a member including a second material on the protective film and between the structures adjacent to each other.

15. The method of claim 14, wherein the first material is a conductive or semi-conductive material, and the second material is an insulating material.

16. The method of claim 14, wherein the first material is an insulating material, and the second material is a conductive or semi-conductive material.

17. The method of claim 14, wherein one of the first material and the second material is a conductive or semi-conductive material, and the other of the first material and the second material is an insulating material.

18. The method of claim 1, wherein in the forming the polymer film, a gas containing a first monomer and a gas containing a second monomer are supplied into a container in which the substrate is accommodated, and the polymer film produced by vapor deposition polymerization of the first monomer and the second monomer is formed around the plurality of structures.

19. The method of claim 1, wherein the forming the polymer film is performed at a lower temperature than the heating the polymer film.

20. The method of claim 1, wherein the temporary sealing film is an oxide film or a nitride film.

* * * * *